(12) United States Patent
Haraguchi et al.

(10) Patent No.: US 7,358,129 B2
(45) Date of Patent: Apr. 15, 2008

(54) NONVOLATILE SEMICONDUCTOR MEMORY DEVICE AND A METHOD OF THE SAME

(75) Inventors: Keiichi Haraguchi, Hitachinaka (JP); Masataka Kato, Abiko (JP); Kenji Kanamitsu, Hitachinaka (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/583,092

(22) Filed: Oct. 19, 2006

(65) Prior Publication Data

US 2007/0034935 A1 Feb. 15, 2007

Related U.S. Application Data

(62) Division of application No. 11/147,310, filed on Jun. 8, 2005, now Pat. No. 7,126,184.

(30) Foreign Application Priority Data

Jun. 8, 2004 (JP) ............................. 2004-169660

(51) Int. Cl.
  *H01L 21/8238* (2006.01)
  *H01L 21/336* (2006.01)
  *H01L 29/788* (2006.01)
(52) U.S. Cl. .................. 438/201; 438/211; 438/257; 438/593; 257/E21.179; 257/E21.422
(58) Field of Classification Search ............... 438/201, 438/211, 257, 593; 257/E21.179, E21.422, 257/E21.68, 315
See application file for complete search history.

(56) References Cited

U.S. PATENT DOCUMENTS

| 7,195,968 B2 * | 3/2007 | Kamiya et al. ............. 438/217 |
| 2005/0127429 A1 | 6/2005 | Otsuga et al. |
| 2006/0022259 A1 * | 2/2006 | Kobayashi et al. ......... 257/321 |

FOREIGN PATENT DOCUMENTS

| JP | 2694618 | 9/1997 |
| JP | 2001-156275 | 6/2001 |
| JP | 2002-373948 | 12/2002 |

* cited by examiner

*Primary Examiner*—Long K. Tran
(74) *Attorney, Agent, or Firm*—Antonelli, Terry, Stout & Kraus, LLP.

(57) ABSTRACT

A reduction in size nonvolatile semiconductors for use in a memory device and an increase in the capacity thereof are promoted. Each memory cell of a flash memory is provided with a field effect transistor having a first gate insulator film formed on a p-type well, a selector gate which is formed on the first insulator film and has side faces and a top face covered with a silicon oxide film (first insular film), floating gates which are formed in a side-wall form on both sides of the selector gate and which are electrically isolated from the selector gate through the silicon oxide film, a second gate insulator film formed to cover the silicon oxide film and the surface of each of the floating gates, and a control gate formed over the second gate insulator film.

6 Claims, 19 Drawing Sheets

VOLTAGE RELATIONSHIP WHEN THE SELECTED CELL WORKS

|  | W1 | S1 | S2 | G1 | G2 | G3 | G4 |
|---|---|---|---|---|---|---|---|
| WRITE | 15 | 5 | 0 | 6 | 0 | 2 | 0 |
| ERASURE | -18 | 0 | 0 | 0 | 0 | 2 | 0 |
| READ | 3 | 1 | 0 | 2 | 0 | 2 | 0 |

WRITE-TIME EQUIVALENT CIRCUIT

WRITE/READ-TIME EQUIVALENT CIRCUIT

FIG. 23

VOLTAGE RELATIONSHIP WHEN THE SELECTED CELL 1 WORKS

|         | W1  | S1 | S2 | G1 | G2 | SG1 | SG2 | SG3 | SG4 |
|---------|-----|----|----|----|----|-----|-----|-----|-----|
| WRITE   | 15  | 0  | 5  | 0  | 6  | 2   | 0   | 0   | 6   |
| ERASURE | -18 | 0  | 0  | 0  | 0  | 0   | 0   | 0   | 0   |
| READ    | 3   | 0  | 1  | 0  | 2  | 2   | 0   | 0   | 2   |

FIG. 24

VOLTAGE RELATIONSHIP WHEN THE SELECTED CELL 2 WORKS

|         | W1  | S1 | S2 | G1 | G2 | SG1 | SG2 | SG3 | SG4 |
|---------|-----|----|----|----|----|-----|-----|-----|-----|
| WRITE   | 15  | 5  | 0  | 0  | 2  | 6   | 0   | 0   | 2   |
| ERASURE | -18 | 0  | 0  | 0  | 0  | 0   | 0   | 0   | 0   |
| READ    | 3   | 1  | 0  | 0  | 2  | 2   | 0   | 0   | 2   |

NONVOLATILE SEMICONDUCTOR MEMORY DEVICE AND A METHOD OF THE SAME

CROSS-REFERENCE TO RELATED APPLICATION

The present application is a Divisional application of U.S. application Ser. No. 11/147,310, filed Jun. 8, 2005now U.S. Pat. No. 7,126,184, which claims priority from Japanese patent application No. 2004-169660, filed Jun. 8, 2004, the content of which is hereby incorporated by reference into this application.

BACKGROUND OF THE INVENTION

The present invention relates in general to a nonvolatile semiconductor for use as a memory device and to a method for producing the same, and, in particular, to a technique which is useful for achieving an increase in the memory capacity of flash memories.

As a memory wherein data can be erased at a time, among nonvolatile semiconductor memories wherein data can be electrically rewritten, the so-called flash memory is known. The flash memory has excellent portability and impact resistance, and data memorized therein can be electrically erased at a time. In recent years, therefore, the demand for the flash memory has been expanding rapidly as a memory device for use in small-sized portable information-processing instruments, such as portable personal computers and digital still cameras. However, in order to expand the market thereof, it is important to make the area of the memory cells smaller, thereby decreasing the cost per bit.

Japanese Patent No. 2694618 describes a flash memory having imaginary-grounding type memory cells, each using three-layer polysilicon gates. Each of the memory cells described in this document is composed of a semiconductor region, which is formed in a well in a semiconductor substrate, and three gate electrodes. The three gates are a floating gate formed over the well, a control gate formed to extend over both the well and the floating gate, and an erasing gate formed between the control gate, a control gate adjacent thereto and the floating gate. The three gate electrodes are each made of polysilicon, and they are separated from each other through an insulator film. The floating gate and the well are also separated from each other through an insulator film. The control gates of plural memory cells are connected to each other in the row direction so as to constitute a word line. Source and drain diffusion layers of the memory cells are formed in the column direction, and any one of the diffusion layers is commonly used between memory cells that are disposed adjacent to each other. Thus, the memory cells turn into an imaginary grounding type. As a result, the pitch thereof in the column direction is small. Each of the erasing gates is arranged in parallel to each channel, and also in parallel to the word lines (control gates), between the word lines.

When data is written in a selected one of the memory cells, independent positive voltages are applied to the word line and the drain thereof, and further voltages at the well, the source and the erasing gate thereof are set to 0 V. In this way, hot electrons are generated in the channel region near the drain, and then the electrons are injected into the floating gate so that the threshold value of the selected memory cell rises. When data is erased, a positive voltage is applied to the erasing gate, and further voltages at the word line, the source, the drain and the well are set to 0 V. In this way, electrons are discharged from the floating gate to the erasing gate so that the threshold value lowers.

Japanese Unexamined Patent Publication No. 2002-373948 discloses a flash memory equipped with split gate type memory cells having an AND mode array structure. In each of the memory cells described in this document, a trench is made in a substrate; an auxiliary gate is buried in the trench; and a diffusion layer, which becomes a data line, and the channel region of the auxiliary gate are formed on the bottom face and the side faces of the trench. In this way, the pitch of the memory cells in the data line direction is small.

Japanese Unexamined Patent Publication No. 2001-156275 discloses a nonvolatile semiconductor memory having memory cells each using three-layer polysilicon gates. In each of the memory cells described in this document, a third gate electrode, which is different from a floating gate and a control gate, is extended in the data line direction of the memory. A reversion layer formed in the substrate, when the channel under the third gate electrode is turned on, is used as a data line. This makes it possible to delete any diffusion layer in the memory array. Consequently, the pitch of the data lines can be small.

SUMMARY OF THE INVENTION

The AND mode flash memory which the inventors have investigated is composed of memory cells, each of which is made of a field effect transistor having three gates over a p-type well. The three gates which constitute each of the memory cells are a floating gate, a control gate, and a selector gate. The selector gate is formed across a first gate insulator film (tunnel oxide film) over the p-type well. The floating gate is formed between the selector gate and a selector gate adjacent thereto, and it is electrically insulated from the p-type well through the first gate insulator film. The floating gate and the selector gate are insulated from each other through insulator films on side walls of the selector gate, and the floating gate and the control gate that is formed over it are insulated through a second insulator gate film. The control gate is extended in the row direction so as to constitute a word line. The selector gate is extended in the column direction, which is perpendicular to the word line. The source and drain of the memory cell are formed in the p-type well under one of the side walls of the selector gate, and they are extended in the column direction, which is perpendicular to the word line, thereby constituting a local bit line.

In order to write data in a selected one of the memory cells, 15 V is applied to the word line of the selected memory cell (voltages at the other word lines: 0 V) and 1.2 V is applied to the selector gate thereof (voltages at the other selector gates: 0 V). Simultaneously, 0 V is applied to the n-type semiconductor region (source) thereof and 4.5 V is applied to the n-type semiconductor region (drain) of the memory cell which is connected to the same word line and is adjacent to the selected memory cell. In this way, a part of the electrons (hot electrons) flowing from the source to the drain are injected through the first gate insulator film (tunnel oxide film) into the floating gate.

In order to form the floating gates of the above-mentioned memory cells, a polycrystal silicon film is first deposited on a semiconductor substrate wherein selector gates are formed. This polycrystal silicon film is deposited so as to have such a small thickness that the gap between any two adjacent ones of the selector gates is not buried. Next, the gap between the two adjacent selector gates is buried with an insulator film that has a different etch selectivity than that of the polycrystal silicon film, such as an antireflective film, on the polycrystal silicon film inside the gaps. In this state, the polycrystal silicon film which is arranged over the insulator film and covers the top of the selector gates is etched, so that the polycrystal silicon film remains between the two adjacent selector gates. The remaining silicon film becomes the floating gates.

However, in the case where the shrinkage of memory cells is further advanced, the interval between any two adjacent selector gates therein becomes very short according to the floating gate forming method described above. Accordingly, it is difficult to deposit a polycrystal silicon film on a semiconductor substrate in such a way that selector gates are formed and, subsequently, a gap between any two adjacent ones out of these selector gates is buried with an antireflective film on the polycrystal silicon film inside the gap. Therefore, it is impossible to produce floating gates having a desired shape with a good yield.

In a flash memory wherein each floating gate is formed between any two adjacent selector gates, the coupling ratio, which is represented by the ratio of the electrostatic capacity (Cfg-cg) between the floating gate and its control gate to the total electrostatic capacity (Ctot) of the periphery of the floating gate, (Cfg-cg/Ctot) becomes lower as the memory cells in this memory are shrunk to a smaller size. As a result, the memory cells are not easily operated at high speed.

An object of the present invention is to provide a technique for making the memory capacity of a nonvolatile semiconductor for a memory device large by promoting the shrinkage of its memory cells.

The above-mentioned object, other objects of the invention, and new features thereof will be made evident from the following description in the present specification and form the attached drawings.

A typical aspect of the present invention is briefly described as follows:

The nonvolatile semiconductor for a memory device of the present invention includes plural memory cells which each comprise a field effect transistor comprising:

a first gate insulator film which is formed over a main face of a semiconductor substrate of a first conductivity type, a selector gate which is formed over the first gate insulator film and has side faces and a top face covered with a first insulator film, plural floating gates, which are formed, in a side-wall form, over both sides of the selector gate, are electrically separated from the selector gate by the first insulator film, a second gate insulator film is formed to cover the surface of the floating gates, and a control gate, which is formed over the second gate insulator film, is electrically separated from the floating gate by the second gate insulator film, and is electrically separated from the selector gate by the second gate insulator film and the first insulator film, the memory cells being arranged in a matrix form along a first direction of the main face of the semiconductor substrate and along a second direction perpendicular to the first direction, wherein the control gates of the memory cells arranged in each row along the first direction are connected to each other to constitute a word line, and the selector gates of the memory cells arranged in each column along the second direction are connected to each other.

Briefly, an advantageous effect of the typical aspect of the present invention makes it possible to promote the shrinkage of a nonvolatile semiconductor for a memory device and to achieve an increase in the capacity thereof.

BRIEF DESCRIPTION OF THE DRAWINGS

FIG. 23 is a table showing a relationship between voltages applied to a word line and to selector gates and reversion layers of memory cells at the time of writing, reading and erasing operations.

FIG. 24 is a table showing another relationship between voltages applied to the word line and to the selector gates and the reversion layers of the memory cells at the time of writing, reading and erasing operations.

BEST MODES FOR CARRYING OUT THE INVENTION

With reference to the drawings, various embodiments of the present invention will be described in detail hereinafter. In all of the figures, the same reference numbers are in principle attached to the same members, and a repeated description thereof is omitted.

Embodiment 1

Figure 1:
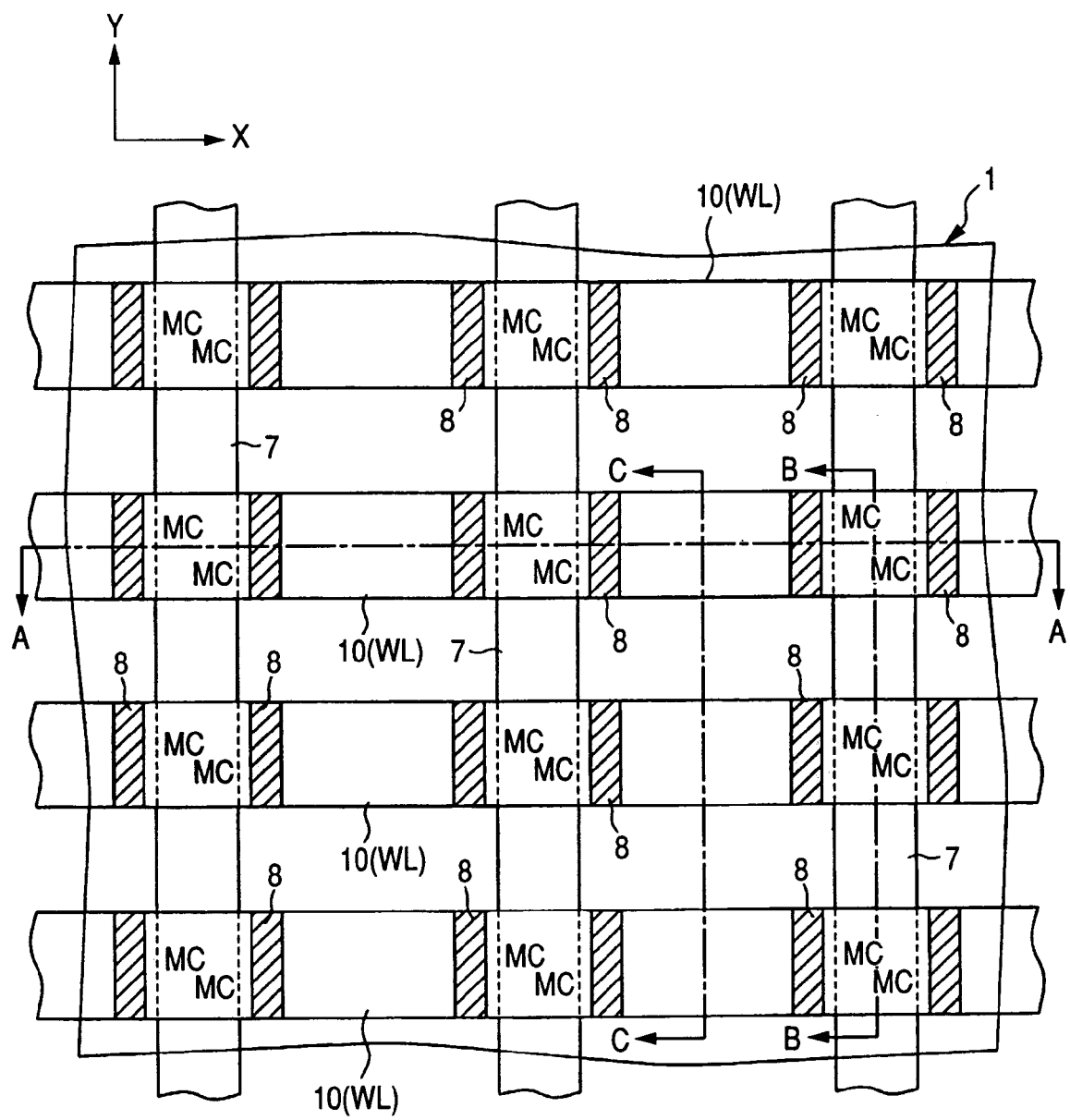
FIG. 1 is a partial plan view illustrating a memory mat structure of a flash memory which represents an embodiment of the present invention.
Figure 2:
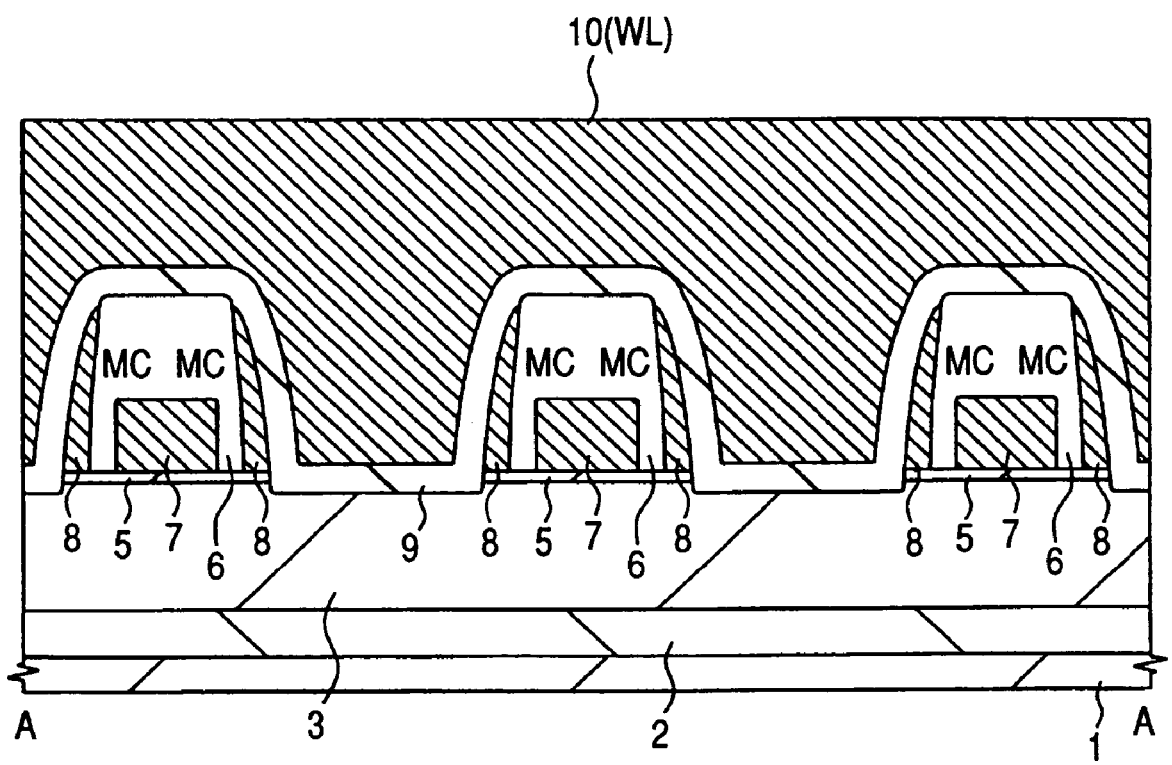
FIG. 2 is a partial sectional view of a semiconductor substrate, which is taken along line A-A in FIG. 1.
Figure 3:
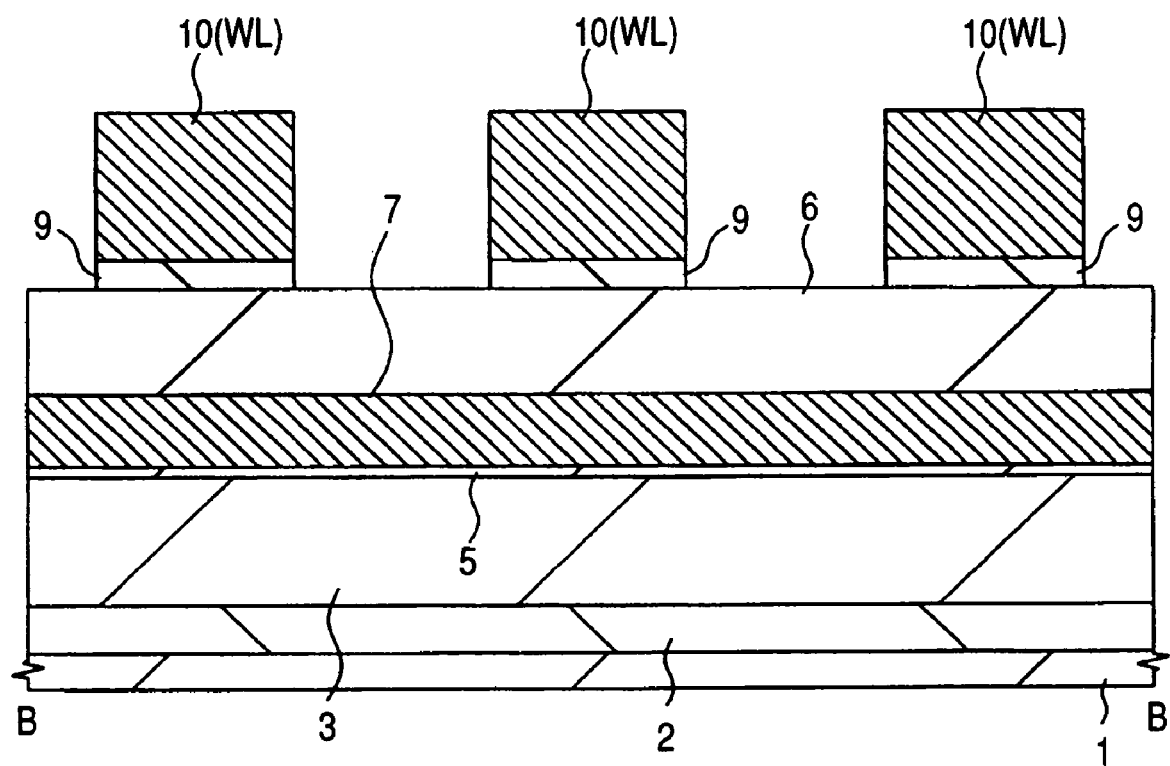
FIG. 3 is a partial sectional view of the semiconductor substrate, which is taken along line B-B in FIG. 1.
Figure 4:
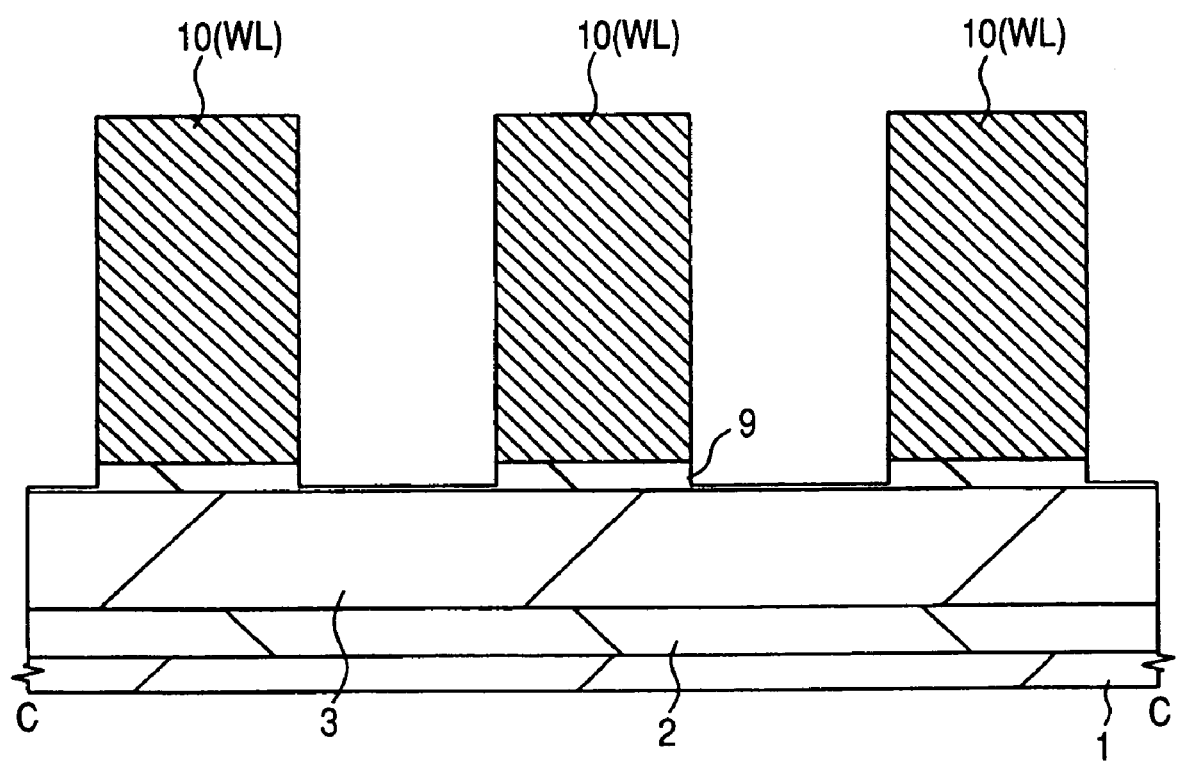
FIG. 4 is a partial sectional view of the semiconductor substrate, which is taken along line C-C in FIG. 1.

FIG. 1 is a partial plan view illustrating a memory mat structure of a flash memory which represents embodiment 1 of the present invention, FIG. 2 is a partial sectional view of a semiconductor substrate, which is taken along line A-A in FIG. 1, FIG. 3 is a partial sectional view of the semiconductor substrate, which is taken along line B-B in FIG. 1, and FIG. 4 is a partial sectional view of the semiconductor substrate, which is taken along line C-C in FIG. 1. In FIG. 1 (of the plane view), illustration of some members is omitted in order to make the pattern of an electroconductive layer easy to see.

The flash memory of the present embodiment is an AND mode flash memory having a capacity of 16 Gb (gigabits). Memory cells MC which constitute this flash memory are arranged, into a matrix form, in memory mat areas of a main surface of a semiconductor substrate 1, which will be referred to hereinafter merely as the substrate 1. The substrate 1 is made of a p-type silicon (Si) monocrystal. An n-type buried layer 2 is formed thereon. A p-type well 3 is formed on the n-type buried layer 2. The n-type buried layer 2 separates the p-type well 3 and the substrate 1 in each of the memory mats, and is it formed in order to supply a given voltage to the p-type well 3 of each of the memory mats.

The memory cells MC are formed on the p-type well 3 of the memory mat area. The memory cells MC each constitute a field effect transistor having a first gate insulator film 5 formed on the surface of the p-type well 3, a selector gate 7 which is formed on the first gate insulator film 5 and has side faces and a top face covered with a silicon oxide film (first insulator film) 6, the floating gates 8 of which are formed into a side wall form on both sides of the selector gate 7 and are electrically separated from the selector gate 7 by the silicon oxide film 6, a second gate insulator film 9 formed to cover the silicon oxide film 6 and the surface of each of the floating gates 8, and a control gate 10 formed on the second gate insulator film 9.

The control gate 10 is electrically separated from the floating gate 8 by the second gate insulator film 9, and it is electrically separated from the selector gate 7 by the second gate insulator film 9 and the silicon oxide film 6. As to the plural memory cells MC arranged in each row along the X direction in FIG. 1, their control gates 10 are connected to each other so as to be integrated with each other, thereby constituting a single word line WL.

The first gate insulator film 5 is made of a silicon oxide or silicon oxynitride and has a film thickness of about 9 nm. When data is written in a selected one of the memory cells MC, the first gate insulator film 5 becomes a path for injecting hot electrons generated in the surface (channel region) of the p-type well 3 into the floating gate 8, so as to function as a so-called tunnel oxide film.

The selector gates 7 are each made of an n-type polycrystal silicon film, and the gate length (the width along the X direction) and the height thereof are each about 40 nm. The interval between any two adjacent ones, along the X direction, of the selector gates 7 is about 140 nm. The selector gates 7 of the plural memory cells MC arranged in each column along the Y direction are connected to each other so as to be integrated with each other. As to the silicon oxide film 6 covering the periphery of each of the selector gates 7, the film thickness thereof is about 15 nm on the side faces of the selector gate 7, and it is about 60 nm on the top face of the selector gate 7.

Each of the floating gates 8 is made of an n-type polycrystal silicon film or the like. The gate length thereof (i.e., the width in the X direction of the portion thereof contacting the first gate insulator film 5) is about 15 nm. The top end of the floating gate 8 extends up to the vicinity of the top end of the silicon oxide film 6 covering the selector gate 7. As to this floating gate 8, which is formed in a side wall form on each side face of the silicon oxide film 6, the ratio of the gate length to the height thereof (i.e., the aspect ratio) is large (for example, 5 or more), that is, the contact area between the side-wall-form floating gate 8 and the insulator film 9 is larger than that between the floating gate 8 and the insulator film 5; therefore, even if the size of the moving cell MC is made small, the ratio by area of the floating gate portion which faces the control gate 10 across the second gate insulator film 9 can be made large. In other words, the coupling ratio, which is represented by the ratio of the electrostatic capacity (Cfg-cg) between the floating gate 8 and the control gate 10 to the total electrostatic capacity (Ctot) of the periphery of the floating gate 8, (Cfg-cg/Ctot), can be set to 0.8 or more. Accordingly, the voltage is controllability of the floating gate 8 by the control gate 10 can be improved. Thus, the operating speed of the memory cell MC can be improved even at a low voltage.

The second gate insulator film 9 for insulating each of the floating gates 8 from the corresponding control gate 10 is composed of three insulator films (a silicon oxide film, a silicon nitride film, and a silicon oxide film), and the film thickness thereof is about 20 nm. The control gate 10 (word line WL) is made of an electroconductive film such as an n-type polycrystal silicon film, or a polycide film wherein a tungsten silicide ($WSi_x$) film is laminated on an electroconductive film, such as an n-type polycrystal silicon film.

The field effect transistor which constitutes each of the memory cells MC does not have any source or drain when the transistor is not operating. However, when the memory cell MC operates, an n-type reversion layer is formed in the surface of the p-type well 3 under its selector gate 7 due to application of a positive voltage to the selector gate 7. This reversion layer functions as a source and a drain. The reversion layer is formed along the selector gate 7 extending along the Y direction. Voltages that are different from each other are applied to this n-type reversion layer through sense amplifier system metallic wires (S1 and S2), as will be described in detail later; therefore, the reversion layer also functions as a bit line for the memory cell MC. In the case where the reversion layer formed under the selector gate 7 is used in this way when the memory cell MC operates, it is unnecessary to provide a bit-line-forming region inside the memory mat areas. As a result, the interval between adjacent ones of the memory cells MC can be reduced.

Each of the selector gates 7 has a function of forming such a reversion layer, as described above, in the surface of the p-type well 3, and it also has a function of isolating the memory cells MC that are adjacent to each other. In other words, when a positive voltage is applied to a selected one of the memory cells MC and 0 V is applied to the other selector gates 7, a reversion layer (source and drain) is formed only under the selector gate 7 to which the positive voltage is applied and no reversion layer (source and drain) is formed under the other selector gates 7; therefore, the isolation of the selected memory cell M from the unselected memory cells MC can be realized. Therefore, it is unnecessary to provide any element isolation region inside the memory mat areas. Thus, the interval between adjacent ones of the memory cells MC can be reduced.

In the case of the flash memory of the present embodiment, an element isolation region, which is not illustrated, is formed around each of the memory mat areas, that is, between adjacent ones of the memory mat areas. This element isolation region is composed of well-known element isolation trenches or grooves, called STI (shallow trench isolation) or SGI (shallow groove isolation), wherein a silicon film is buried in trenches or grooves made in the substrate 1. A metal wire made of plural layers, which is not illustrated in FIGS. 1 to 4, is formed across an interlayer dielectric over each of the control gates 10 (word lines WL).

Figure 5:
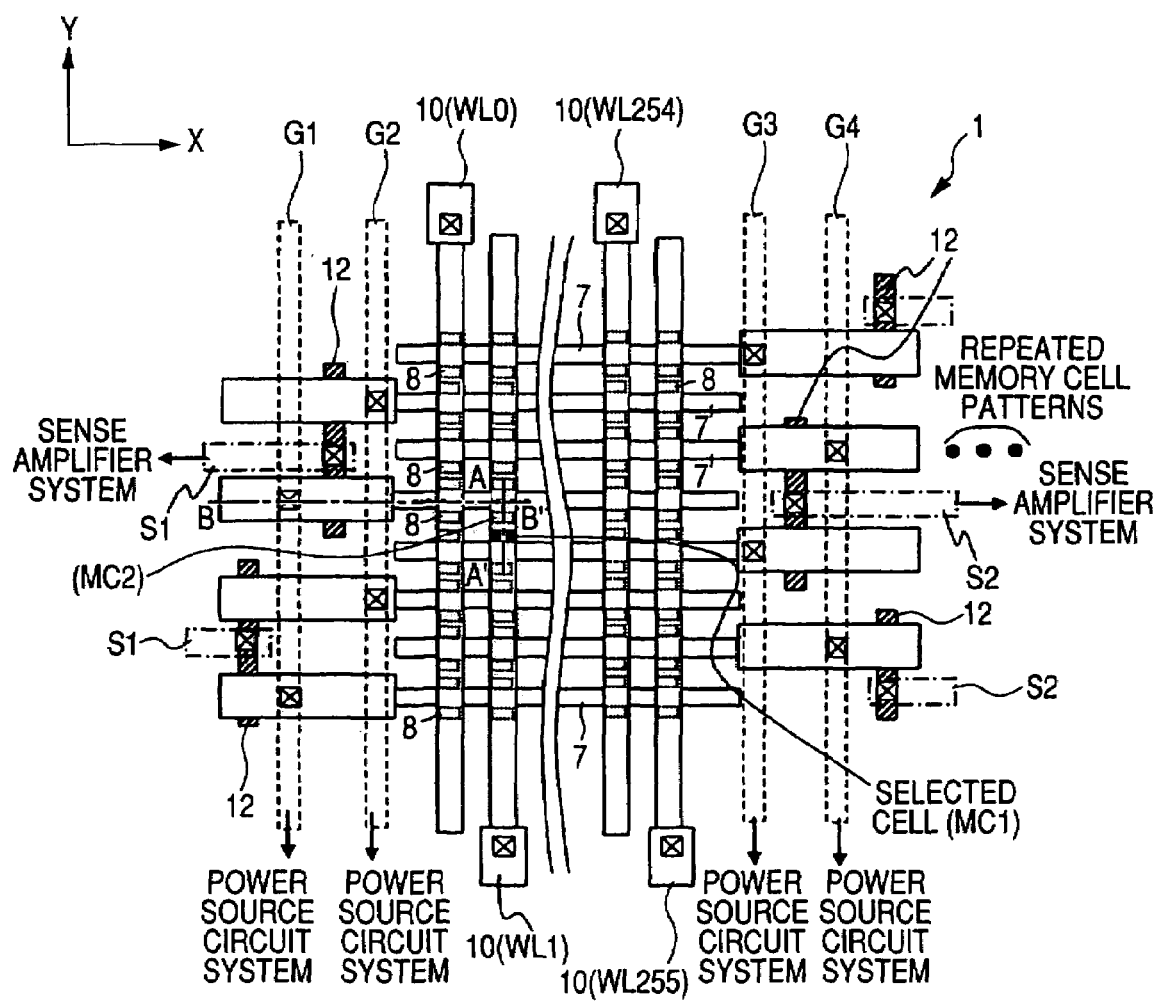
FIG. 5 is a schematic plan view of memory mat areas of a flash memory representing an embodiment of the present invention, and a peripheral area of one of the areas.
Figure 6:
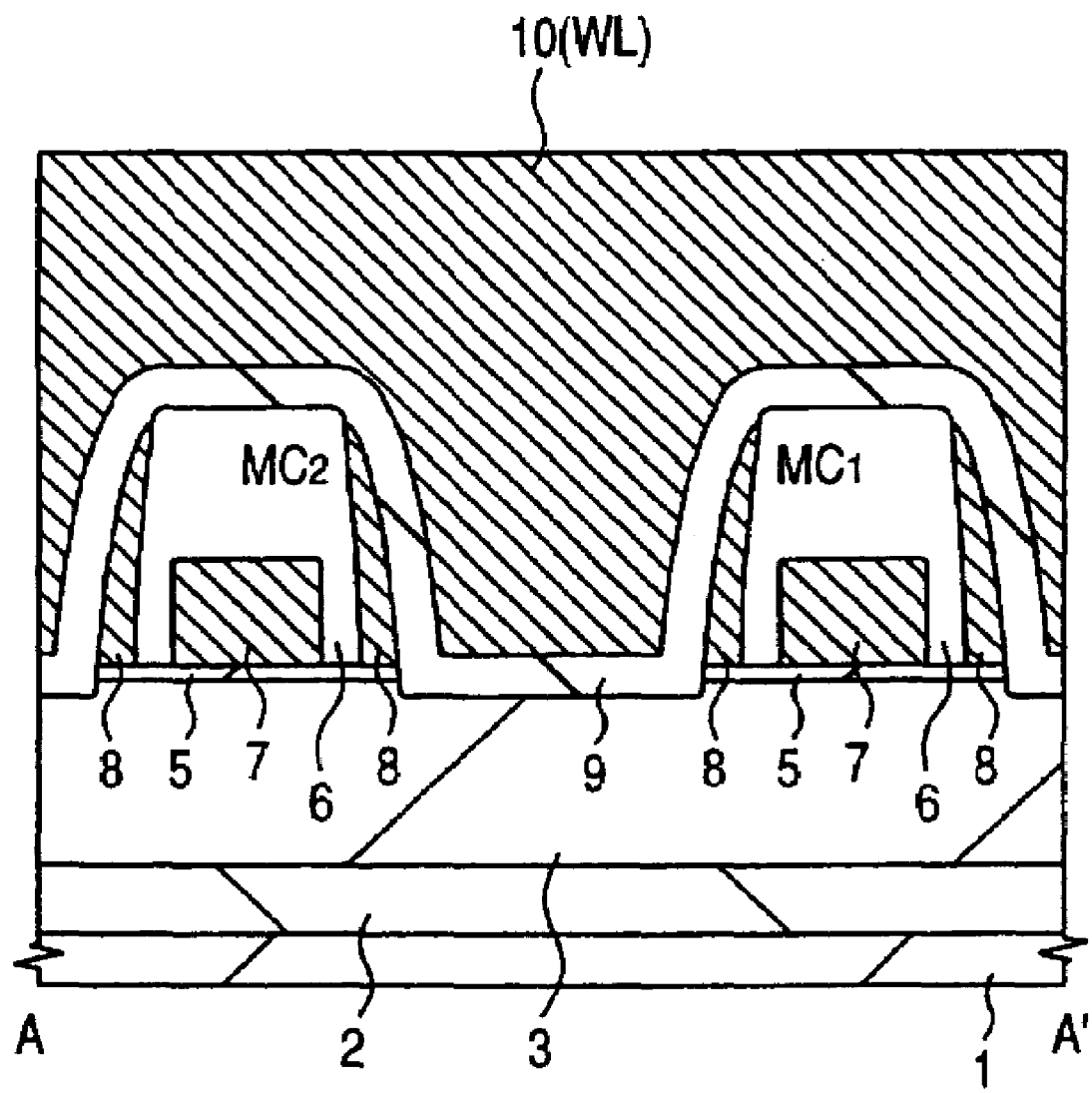
FIG. 6 is a partial sectional view of a substrate 1, which is taken along line A-A' in FIG. 5.
Figure 7:
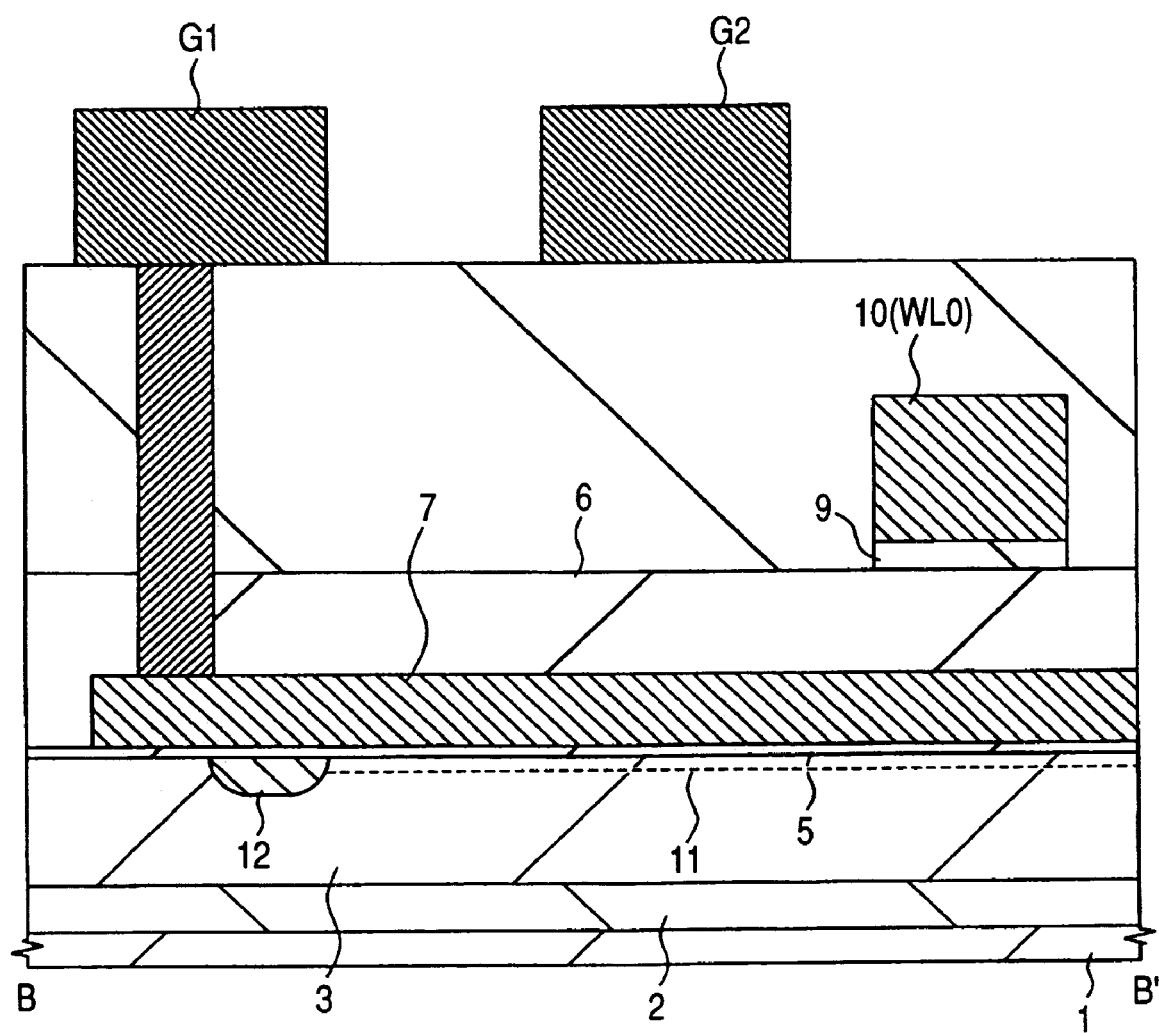
FIG. 7 is a partial sectional view of the substrate 1, which is taken along line B-B' in FIG. 5.

FIG. 5 is a schematic plan view of memory mat areas and a peripheral area of one of the areas, FIG. 6 is a partial sectional view of a substrate 1, which is taken along line A-A' in FIG. 5, and FIG. 7 is a partial sectional view of the substrate 1, which is taken along line B-B' in FIG. 5.

In each of the memory mat areas, for example, 256 word lines (WL0, WL1, . . . , WL254, and WL255) are arranged in parallel to each other. The width of each of the word lines WL is equal to the interval between the word lines WL adjacent to each other. Each of the word lines (WL0, WL1, . . . , WL254, and WL255) functions as a control gate 10 in an area where the word line overlaps with a memory cell MC under the word line.

In the direction (Y direction) perpendicular to the word lines WL (WL0, WL1, . . . , WL254, and WL255), plural selector gates 7 are arranged in parallel to each other. Any four gates, which are arranged side by side, of these selector gates 7 constitute one set. Voltages different from each other can be applied to the four selector gates 7, respectively, in each of the sets through four power source circuit system metallic wires (G1 to G4), one pair and the other pair of which are formed at both end portions in the Y direction of the memory mat area, respectively.

In a p-type well 3 at each end portion in the Y direction of the memory mat area, n+ type diffusion layers 12 are formed. As illustrated in FIG. 7, each of the n+ type diffusion layers 12 is formed under one end of each of the selector gates 7. The n+ type diffusion layers 12 formed at one end of the memory mat area are formed under, for example, selector gates 7 arranged in the order of even numbers of the selector gates 7 formed in the memory mat area. A given voltage is applied to the n+ type diffusion layers 12 through the first sense amplifier metallic wire (S1). On the other hand, the n+ type diffusion layers 12 formed at the other end of the memory mat area are formed under, for example, selector gates 7 arranged in the order of odd numbers of the selector gates 7 formed in the memory mat area. A given voltage is applied to the n+ type diffusion layers 12 through the second sense amplifier metallic wire (S2). In this way, the first sense amplifier system metallic wire (S1) is connected to the n+ type diffusion layers 12 under the selector gates 7 in the order of even numbers and the second sense amplifier system metallic wire (S2) is connected to the n+ type diffusion layers 12 under the selector gates 7 in the order of odd numbers; therefore, when a positive voltage is applied to each of two adjacent ones of the selector gates 7 to form reversion layers in the p-type well 3 the adjacent gates, voltages that are different from each other can be applied to the two reversion layers.

A plurality of the memory mat areas that are configured as described above are formed on the substrate 1, and these memory mat areas constitute a memory array of AND mode flash memories having a capacity of 16 GB (gigabits). Around the memory array, peripheral circuits are formed for driving the memory cells MC in each of the memory mat areas (such as a column decoder, a row decoder, a column latch, a well control circuit, a booster circuit, a boosting clock circuit, and a voltage cramping circuit). Illustration thereof is omitted.

Figures 8, 9:
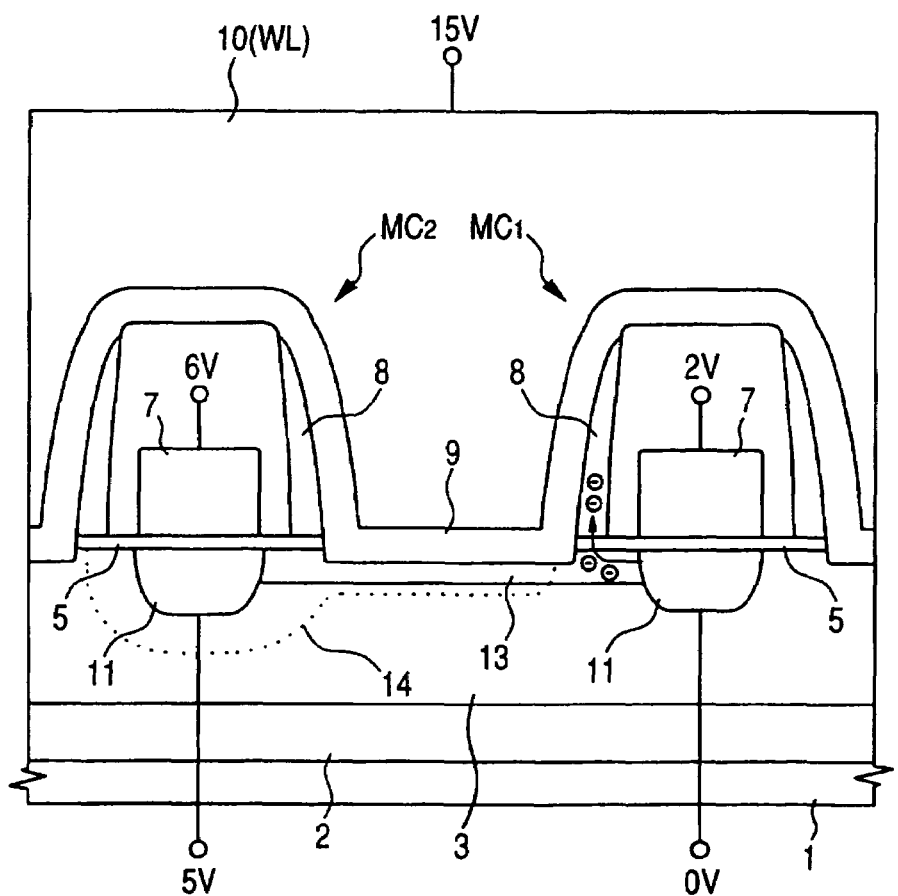
FIG. 8 is a table showing a relationship between voltages applied to a word line and to selector gates and reversion layers of memory cells at the time of writing, reading and erasing operations.
FIG. 9 is a sectional view illustrating the writing operation of memory cells.

The write, read and erasure operations of the memory cells MC in accordance with the present embodiment will be described. Attention will be directed to the two memory cells (MC1 and MC2) that are connected to the word line (WL1) illustrated in FIG. 5, and a description will be given for the state in which one memory cell (MC1) thereof is a selected cell and the other memory cell (MC2) is rendered an unselected cell. FIG. 8 shows a relationship between voltages applied to the word line (WL1) and to the selector gate 7 and the reversion layer of each of the memory cells (MC1 and MC2). The voltage values shown in FIG. 8 are mere examples, and the voltages that can be applied are not limited thereto.

In order to write data in the memory cell (MC1), 15 V is applied to the word line (WL1) connected to the memory cells (MC1 and MC2) and 0 V is applied to the other word lines (WL0, Wl2, . . . WL255). Two volts are applied to the selector gate 7 of the memory cell (MC1) through the power source circuit metallic wire G3, and, simultaneously, 6 V is applied to the selector gate 7 of the memory cell (MC2) through the power source circuit metallic wire G1. At this time, 0 V is applied to the selector gates 7 of the other power source circuit metallic wires G2 and G4 so as not to form any inversion layer under these wires.

In this way, the two memory cells (MC1 and MC2) turn on, so that an n-type reversion layer 11 is formed in the surface of the p-type well 3 positioned under each of the selector gates 7 of the memory cells (MC1 and MC2), and, further, a channel region 13 is formed in the surface of the p-type well 3 that is positioned between the memory cells (MC1 and MC2), as illustrated in FIG. 9. At this time, 2 V is applied to the selector gate 7 of the memory cell (MC1), while 6 V, which is higher, is applied to the selector gate 7 of the memory cell (MC2); accordingly, a depletion layer 14 is extended around the n-type reversion layer 11 of the memory cell (MC2), and one end thereof reaches the vicinity of the region under the floating gate 8 of the memory cell (MC1).

Next, 0 V is applied to the n-type reversion layer 11 of the memory cell (MC1) through the sense amplifier system metallic wire S2, and 5 V is applied to the n-type reversion layer 11 of the memory cell (MC2) through the sense amplifier system metallic wire S1. In this way, a voltage difference is generated between the two n-type reversion layers 11, so that the n-type reversion layer 11 of the memory cell (MC2) to which 5 V is applied becomes a drain and the n-type reversion layer 11 of the memory cell (MC1) to which no voltage is applied, becomes a source; therefore, electrons flow from the source to the drain in the channel region 13 between the two n-type reversion layers 11.

Figure 10:
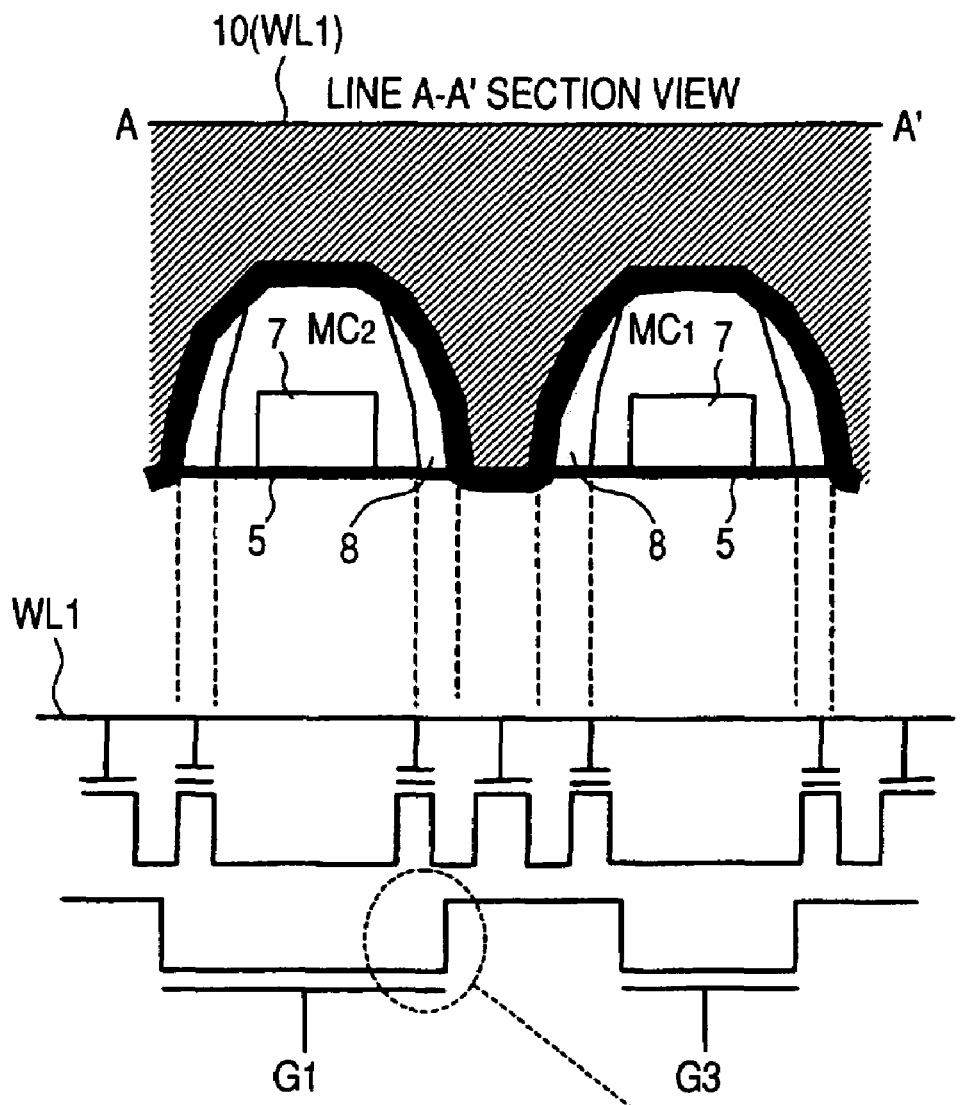
FIG. 10 is an equivalent circuit diagram which schematically illustrates the effect of a depletion layer on memory cells at the time of a writing operation.

As described above, one end of the depletion layer 14, which is formed around the n-type reversion layer 11 of the memory cell (MC2), reaches the vicinity of the region under the floating gate 8 of the memory cell (MC1); therefore, when 5 V is applied to the n-type reversion layer 11 of the memory cell (MC2) and 0 V is applied to the n-type reversion layer 11 of the memory cell (MC1), a high voltage difference (5 V) is generated in the vicinity of the region under the floating gate 8 of the memory cell (MC1). As a result, hot electrons are generated in the channel region 13 under this floating gate 8, so that the hot electrons are injected into the is floating gate 8 through the first gate insulator film 5. On the other hand, the generation of hot electrons is restrained in the vicinity of the region under the floating gate 8 of the memory cell (MC2) by the influence of the depletion layer 14. As a result, no hot electrons are injected into the floating gate 8 of the memory cell (MC2). In this way, data is written only in the selected memory cell (MC1). FIG. 10 is an equivalent circuit diagram which schematically illustrates the effect of the depletion layer 14 on the memory cells (MC1 and MC2) at the time of a write operator.

In the case where data is written in the memory cell (MC2), voltages applied to the selector gate 7 and the n-type reversion layer 11 of each of the two memory cells (MC1 and MC2) are made reverse to those described above. Specifically, 6 V is applied to the selector gate 7 of the memory cell (MC1) in the state in which 15 V is applied to the word line (WL1), and, further, 2 V is applied to the selector gate 7 of the memory cell (MC2). Moreover, 5 V is applied to the n-type reversion layer 11 of the memory cell (MC1), and, further, 0 V is applied to the n-type reversion layer 11 of the memory cell (MC2). In this way, hot electrons generated in the channel region 13 under the floating gate 8 of the memory cell (MC2) are injected through the first gate insulator film 5 into the floating gate 8, so that data is written in the memory cell (MC2). At this time, the generation of hot electrons is restrained in the vicinity of the region under the floating gate 8 of the memory cell (MC1) by the influence of the depletion layer 14 which extends from the n-type reversion layer 11 of the memory cell (MC1). As a result, no hot electrons are injected into the floating gate 8 of the memory cell (MC1). In other words, the depletion layer 14 from the n-type reversion layer 11 of the memory cell (MC2) is extended from the floating gate 8 of the memory cell (MC2) toward the memory cell (MC1); therefore, no hot electrons are injected into the floating gate 8 of the memory cell (MC2).

Four kinds of data, such as "00", "01", "10", and "11", can be written in the memory cell (MC1) as 2 bits/cell. Such multiple value memorization can be attained by changing the amount of hot electrons injected into the floating gate 8 of the selected memory cell (MC1) by changing the writing time, while keeping the writing voltage of the word line (WL1) constant.

In order to read the written data in the memory cell (MC1), the direction of the electric current which flows in the channel region is made reverse to that at the time of a write operation. Specifically, 15 V is applied to the word line (WL1) that is connected to the memory cell (MC1), and 0 V is applied to the other word lines (WL0, WL2, . . . , WL255). Moreover, 2 V is applied to the selector gate 7 of the memory cell (MC1) through the power source circuit system metallic wire G3, and, further, 2 V is applied to the selector gate 7 of the memory cell (MC2) through the power source circuit system metallic wire G1, so as to form the n-type reversion layer 11 under each of the selector gates 7 of the memory cells (MC1 and MC2). At this time, 0 V is applied to the selector gates 7 that are connected to the other power source circuit system metallic wires G2 and G4, so that the n-type reversion layers 11 are not formed under the selector gates. Furthermore, 0 V is applied to the n-type reversion layer 11 of the memory cell (MC1) through the sense amplifier system metallic wire S2, and 1 V is applied to the n-type reversion layer 11 of the memory cell (MC2) through the sense amplifier system metallic wire S1. The threshold voltage of the memory cell (MC1) is detected from the situation of the electric current which flows between the source and the drain, so as to determine whether or not there are charges injected into the floating gate 8. In the same manner as the write-time, the generation of hot electrons is restrained in the vicinity of the region under the floating gate 8 of the memory cell (MC2) by the influence of the depletion layer 14, so that the data in the memory cell (MC2) is not read.

In order to erase the data, a negative voltage (−18 V) is applied to the word line (WL1) so as to discharge the charges injected in the floating gate 8 into the p-type well 3 by F-N (Flowlor-Nordheim) tunnel discharge.

The following description provides an example of the method for producing the flash memory of the present embodiment 1, with reference to FIGS. 11 to 17.

Figure 11:
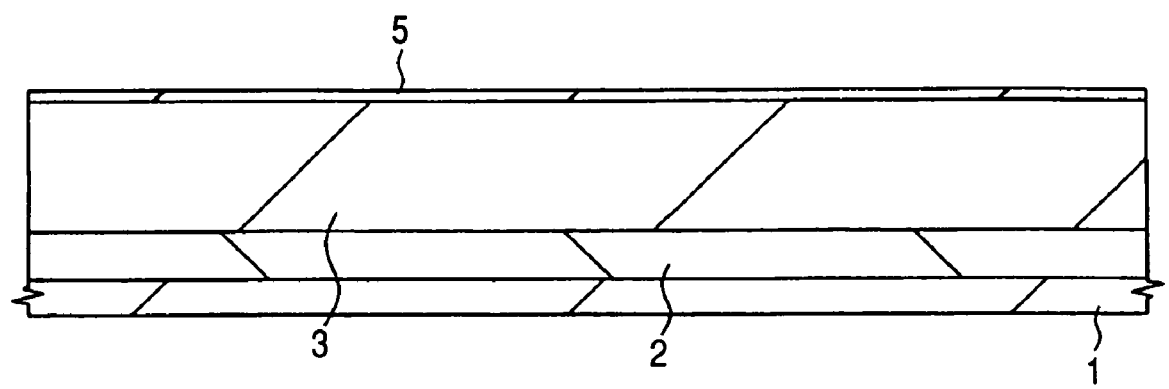
FIG. 11 is a partial sectional view which illustrates a step in the method for producing a flash memory which represents an embodiment of the present invention.

As illustrated in FIG. 11, a well-known production process is first used to form an n-type buried layer 2 and a p-type well 3 on a substrate 1 made of p-type monocrystal silicon. Thereafter, the substrate 1 is thermally oxidized to form a first gate insulator film (tunnel oxide film) 5 made of silicon oxide on the surface of the p-type well 3.

Figure 12:
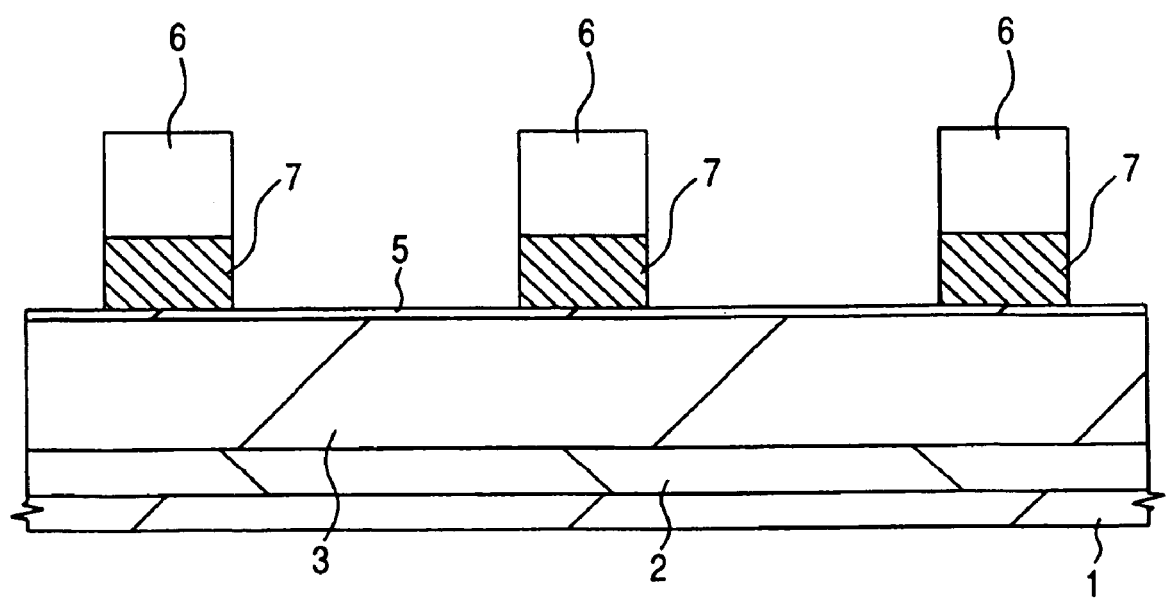
FIG. 12 is a partial sectional view which illustrates a step subsequent to the step illustrated in FIG. 11 in the method for producing the flash memory.

Next, as illustrated in FIG. 12, an n-type polycrystal silicon film of about 40 nm in thickness and a silicon oxide film 6 of about 150 nm in thickness are deposited on the first gate insulator film 5 by CVD. Thereafter, a dry etching technique using a photoresist film as a mask is used to pattern the silicon oxide film 6 and the n-type polycrystal silicon film, thereby forming selector gates 7, each of which has a top face covered with the silicon oxide film 6. The gate length of the selector gates 7 is about 65 nm.

Figure 13:
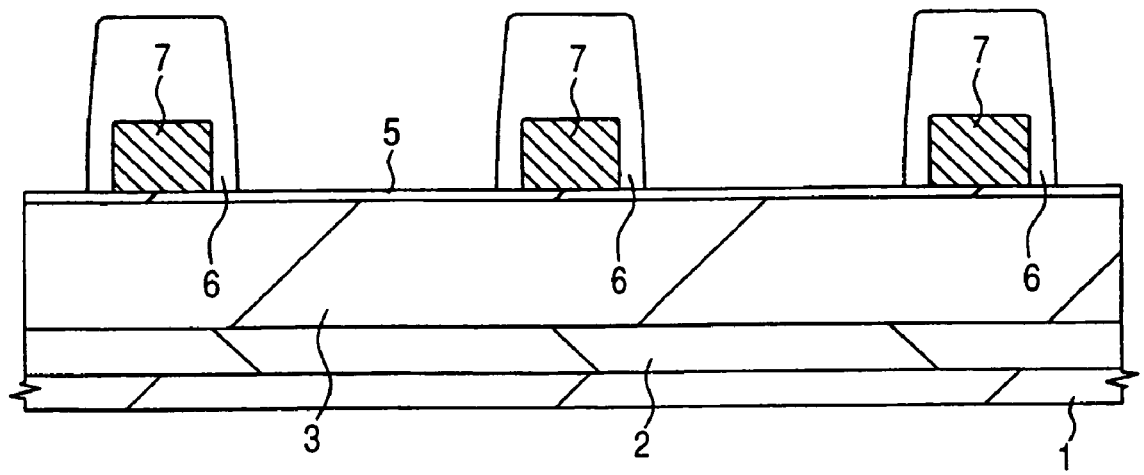
FIG. 13 is a partial sectional view which illustrates a step subsequent to the step illustrated in FIG. 12 in the method for producing the flash memory.

Next, the substrate 1 is thermally oxidized in order to regenerate the first gate insulator film 5 between the selector gates 7, which was etched by the etching for forming the selector gates 7. When this thermal oxidation is performed, side walls of the selector gates 7, which are made of the n-type polycrystal silicon, are simultaneously oxidized, as illustrated in FIG. 13. Thus, the side faces and the top faces of the selector gates 7 are covered with the silicon oxide film 6. Additionally, the thermal oxidation makes the gate length of the selector gates 7 small, so that the length becomes about 40 nm.

Figure 14:
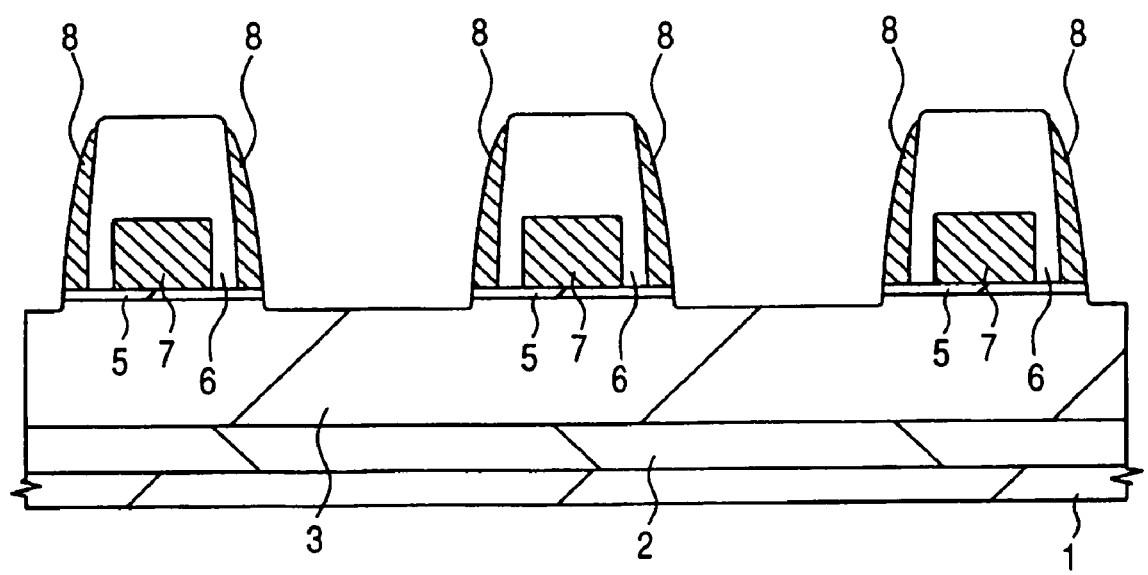
FIG. 14 is a partial sectional view which illustrates a step subsequent to the step illustrated in FIG. 13 in the method for producing the flash memory.

Next, as illustrated in FIG. 14, floating gates 8 in a side wall form are formed on both sides of each of the selector gates 7 that are covered with the silicon oxide film 6. In order to form the floating gates 8, an n-type polycrystal silicon film is first deposited on the substrate 1 by CVD. This n-type polycrystal silicon film is deposited to have such a small film thickness (about 40 nm) that this film is not buried up in gaps between the selector gates 7. Next, this n-type polycrystal silicon film is subjected to anisotropic etching to produce the floating gates 8 having a gate length of about 15 nm and a high aspect ratio, wherein their top ends are extended to the vicinity of the top end of the silicon oxide film 6.

When the above-mentioned anisotropic etching is conducted, the first gate insulator film 5 between the selector gates 7 and the surface of the p-type well 3 below the film 5 is also etched. Consequently, the surface of the p-type well 3 in these regions is shifted downwards.

Figure 15:
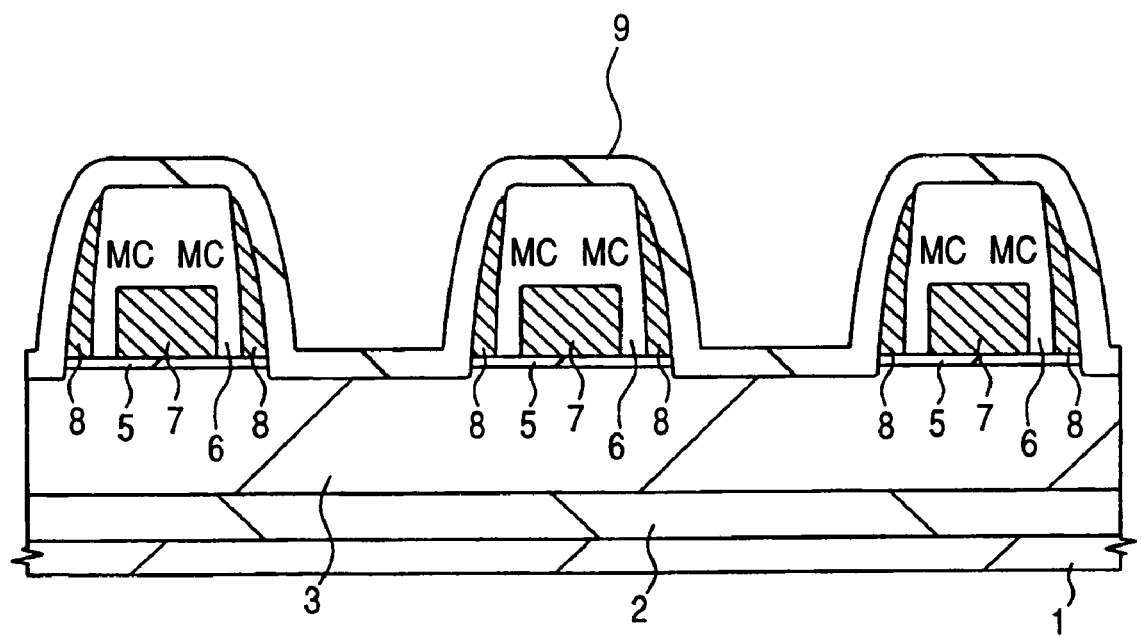
FIG. 15 is a partial sectional view which illustrates a step subsequent to the step illustrated in FIG. 14 in the method for producing the flash memory.

Next, as illustrated in FIG. 15, a second gate insulator film 9 is formed for insulating each of the floating gates 8 from a control gate 10, which will be formed in a subsequent step. The second gate insulator film 9 is composed of three insulator films, wherein a silicon oxide film, a silicon nitride film and a silicon oxide film are laminated in order to cause the electrostatic capacity (Cfg-cg) between the floating gate 8 and the control gate 10 to be large.

The underlying silicon oxide film, among the three insulator films, which constitute the second gate insulator film 9, has a film thickness of about 6 nm. This silicon oxide film may be deposited by CVD. In order to obtain the second gate insulator film 9 having a good quality, it is desired to form the film 9 by a thermal oxidization process rather than by CVD. As described above, however, steps are generated in the surface of the p-type well 3 between the selector gates 7 by the anisotropic etching which is carried out for forming the floating gates 8. Therefore, there is a concern that when ordinary thermal oxidization is conducted in this state, the film thickness of the silicon oxide film becomes uneven on the surface of the step areas, so that the property of the second gate insulator film 9 deteriorates.

Thus, in the present embodiment, an ISSG (in-site steam generation) oxidization process is used instead of the ordinary thermal oxidization process. The ISSG oxidization process is a process in which hydrogen and oxygen are directly introduced into a thermal-treating chamber and then radical oxidization reaction is performed on the substrate 1 that is heated to a high temperature (for example, 900° C.). According to the ISSG oxidization process, enhanced diffusion of oxygen into the substrate 1 is restrained further than it is with thermal oxidization based on the well-known RTP (rapid thermal process). Accordingly, when the surface of the substrate 1 is oxidized using the ISSG oxidization process, a silicon oxide film having a substantially even film thickness can be formed on the surface of the above-mentioned step areas also.

The silicon nitride film, which is an intermediate layer of the second gate insulator film 9, is deposited by CVD. The film thickness of this silicon nitride film is about 8 nm. The silicon oxide on the silicon nitride film is formed by a CVD or thermal oxidization process. In order to obtain silicon oxide having a good quality and an even film thickness, it is desired to form the film using a thermal oxidization process, in particular, the above-mentioned ISSG oxidization process. The film thickness of this silicon oxide film is about 6 nm. The use of both a CVD and the ISSG oxidization process in this way makes it possible to form the second gate insulator film 9 having a substantially even film thickness (about 20 nm) over the whole of the surface of the substrate 1, which includes the surface of the p-type well 3, between the selector gates 7 and the surface of the floating gate 8.

Figure 16:
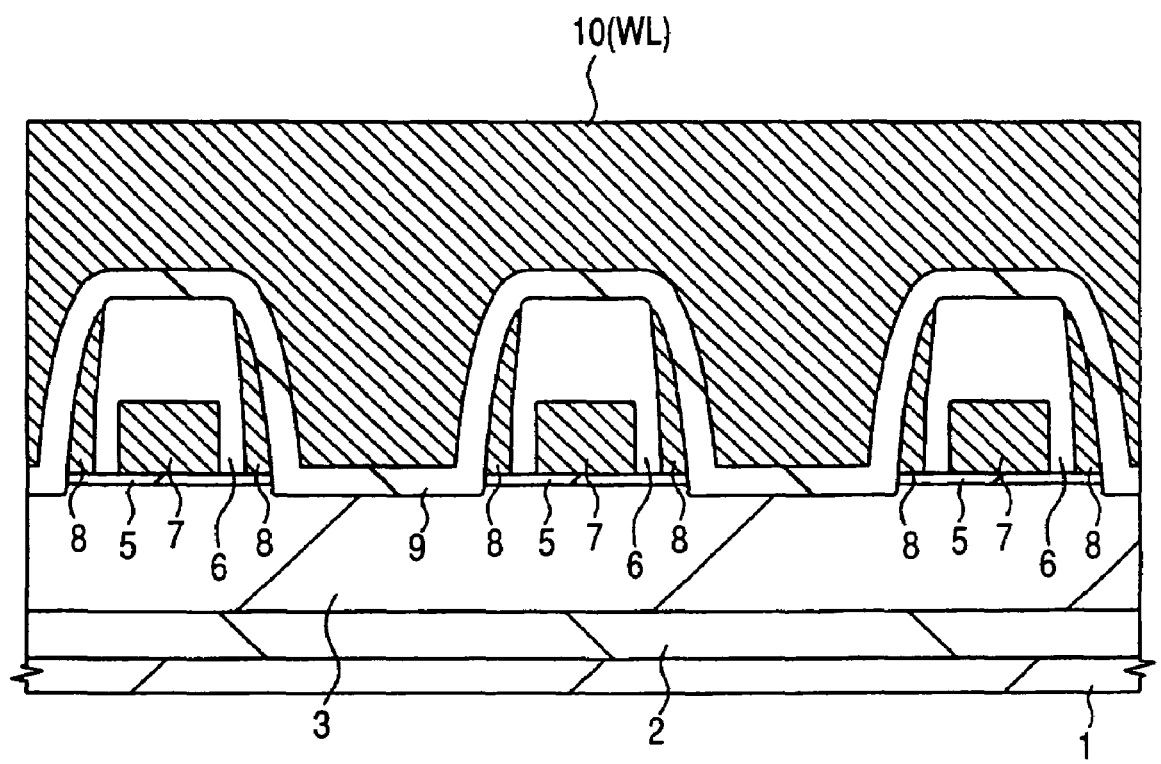
FIG. 16 is a partial sectional view which illustrates a step subsequent to the step illustrated in FIG. 15 in the method for producing the flash memory.

Next, as illustrated in FIG. 16, control gates 10 (word lines WL) are formed on the second gate insulator film 9. In order to form the control gates 10 (word lines WL), an n-type polycrystal silicon film having a film thickness of about 250 nm is deposited on the second gate insulator film 9 by CVD. Subsequently, chemical mechanical polishing is used to make the surface of the n-type polycrystal silicon film flat and smooth, and then a dry etching technique, using a photoresist as a mask, is used to pattern the n-type polycrystal silicon film.

Figure 17:
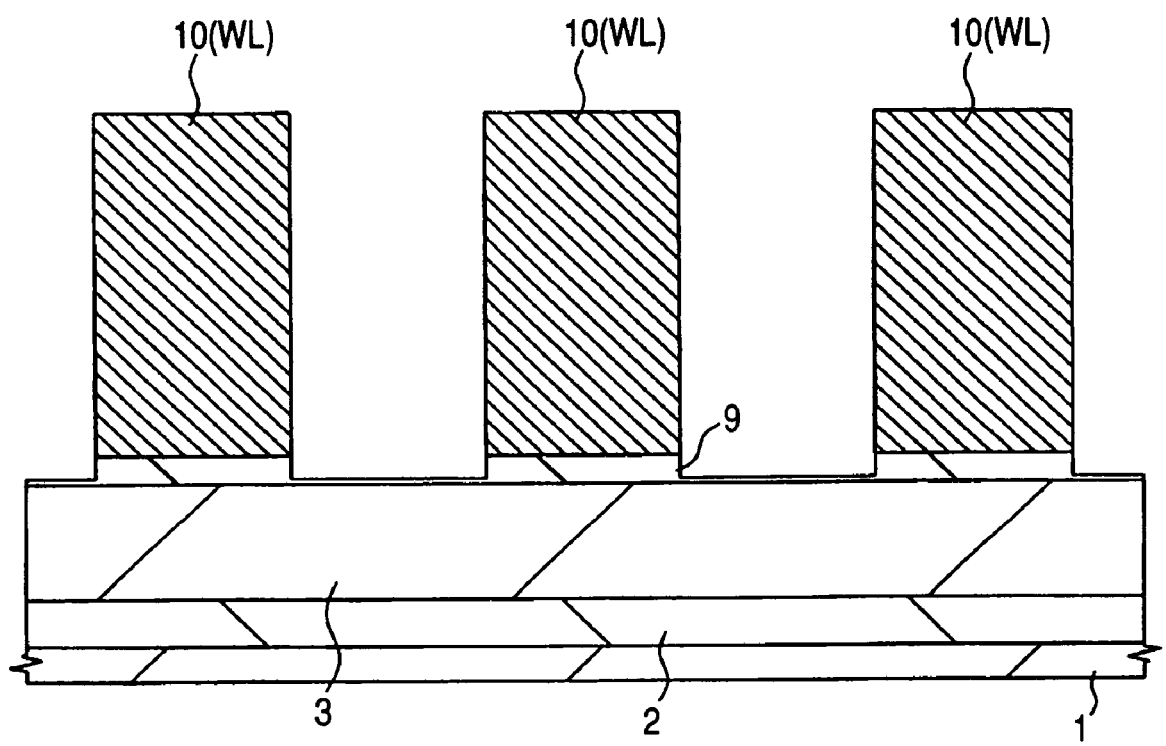
FIG. 17 is a partial sectional view which illustrates a step subsequent to the step illustrated in FIG. 16 in the method for producing the flash memory.

As illustrated in FIG. 17, which is a sectional view taken along line C-C in FIG. 1, at the time of performing the dry-etching for patterning the n-type polycrystal silicon film, over-etching is performed in areas between the control gates 10 (word lines WL) in order to prevent etch residues of the n-type polycrystal silicon film. As described above, the surface of the p-type well 3 in these areas is shifted downwards by the anisotropic etching for forming the floating gates 8 on both sides of each of the selector gates 7, and this surface is subsequently covered with the second gate insulator film 9.

Accordingly, the exposure of the surface of the p-type well 3 is prevented or decreased even if the areas are over-etched when the n-type polycrystal silicon film is patterned. In this way, the leakage current of unselected ones of the memory cells MC is decreased; consequently, the reliability of operation of the flash memory of the present embodiment 1 and the production yield thereof are improved. Since the number of memory cells MC connected to each bit line can be increased, an increase in the memory capacity of the flash memory can be promoted.

Thereafter, metallic wires (such as power source circuit system metallic wires G1 to G4 and sense amplifier system metallic wires S1 and S2) are formed across an interlayer dielectric over the control gates 10 (word lines WL), thereby finishing the flash memory of the present embodiment.

According to the present embodiment, an AND mode flash memory having a large memory capacity can be realized, since the size of memory cells therein can be largely reduced.

Embodiment 2

Figure 18:
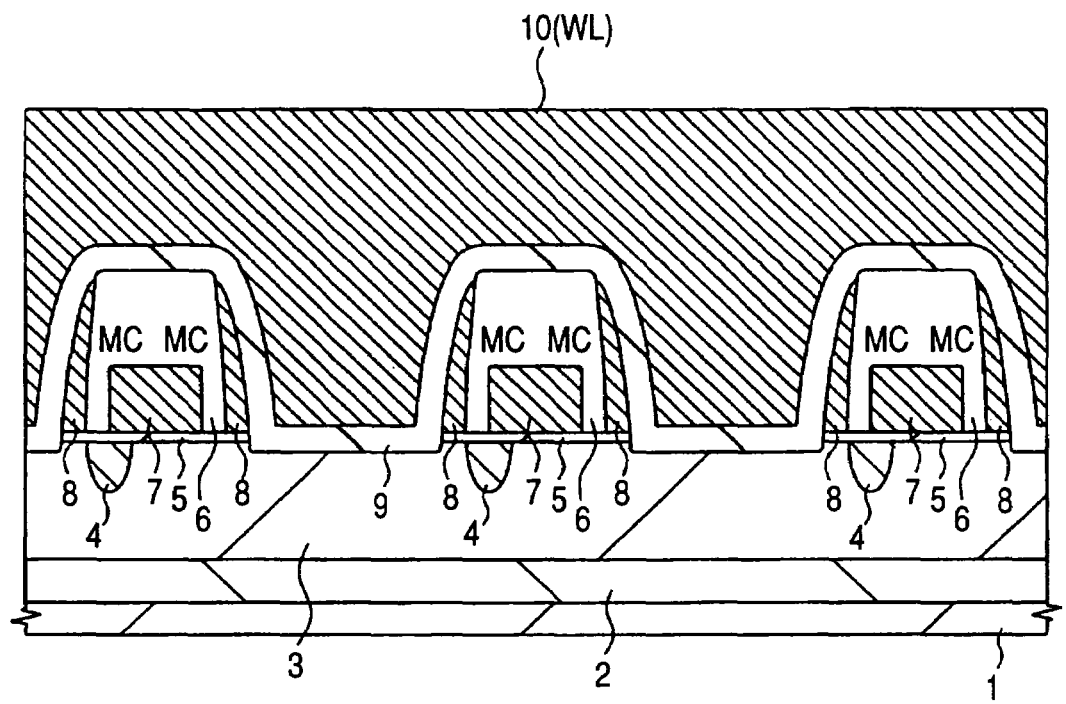
FIG. 18 is a partial sectional view illustrating a memory mat structure of a flash memory which represents a different embodiment of the present invention.

FIG. 18 is a partial sectional view illustrating a memory mat area of a flash memory which represents embodiment 2 of the present invention.

Figure 19:
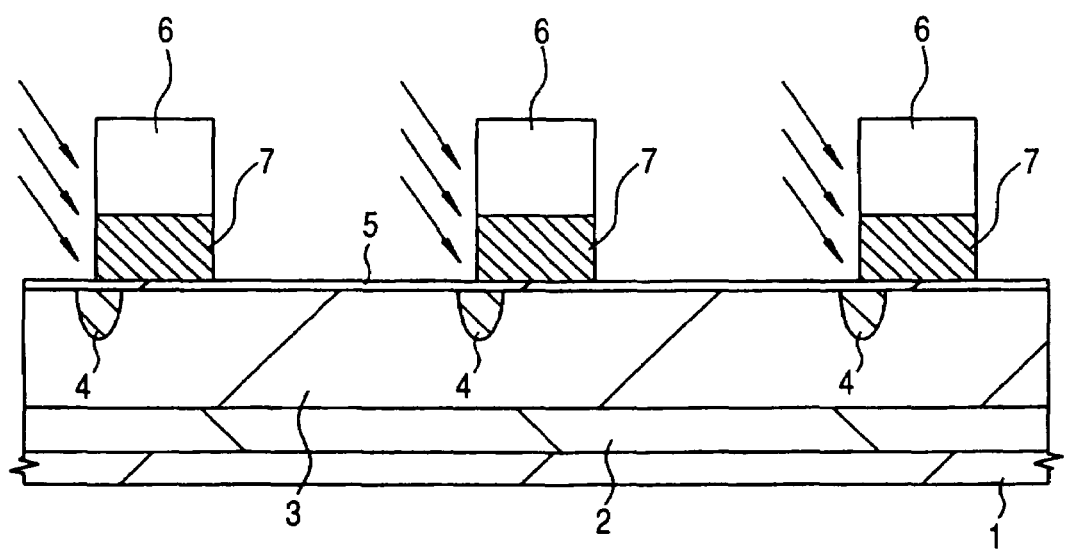
FIG. 19 is a partial sectional view illustrating a method for producing the flash memory illustrated in FIG. 18.

As illustrated in FIG. 18, in each of the memory cells MC of the present embodiment, an n-type diffusion layer 4, functioning as a source and a drain, is formed in the surface of the p-type well 3 under each of the selector gates 7. This layer 4 is used as a bit line. This n-type diffusion layer 4 is formed under one of the side walls of the selector gate 7. In order to form the n-type diffusion layer 4, the selector gate 7 is formed over the p-type well 3 by the method illustrated in FIG. 14, and then oblique ion implantation is used to introduce an n-type impurity into the surface of the p-type well 3, as shown in FIG. 19.

As described above, in the flash memory of embodiment 1, at the time of applying a positive voltage to a selected one of the selector gates 7, the n-type reversion layer 11 formed on the surface of the p-type well 3 under the selector gate is used as a bit line; however, in the flash memory of the present embodiment, the n-type diffusion layers (sources and drains) 4 used as bit lines are beforehand formed in the surface of the p-type well 3. By using the n-type diffusion layers 4 as bit lines, it is possible to make the resistance of the bit lines lower than is possible when using the n-type reversion layers 11 as bit lines.

Figure 20:
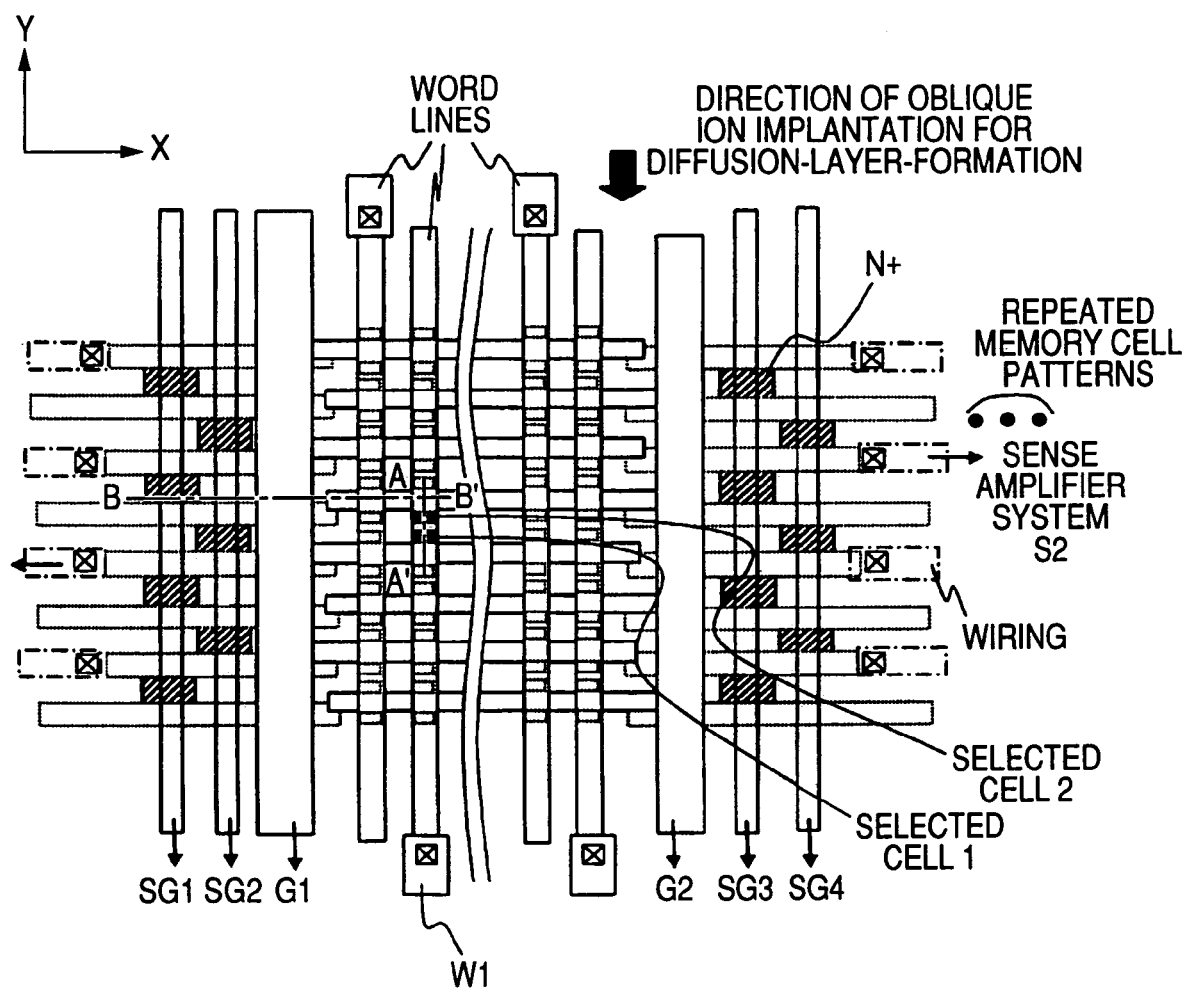
FIG. 20 is a schematic plan view of memory mat areas of the flash memory of the different embodiment of the present invention, and a peripheral area of one of the areas.
Figure 21A:
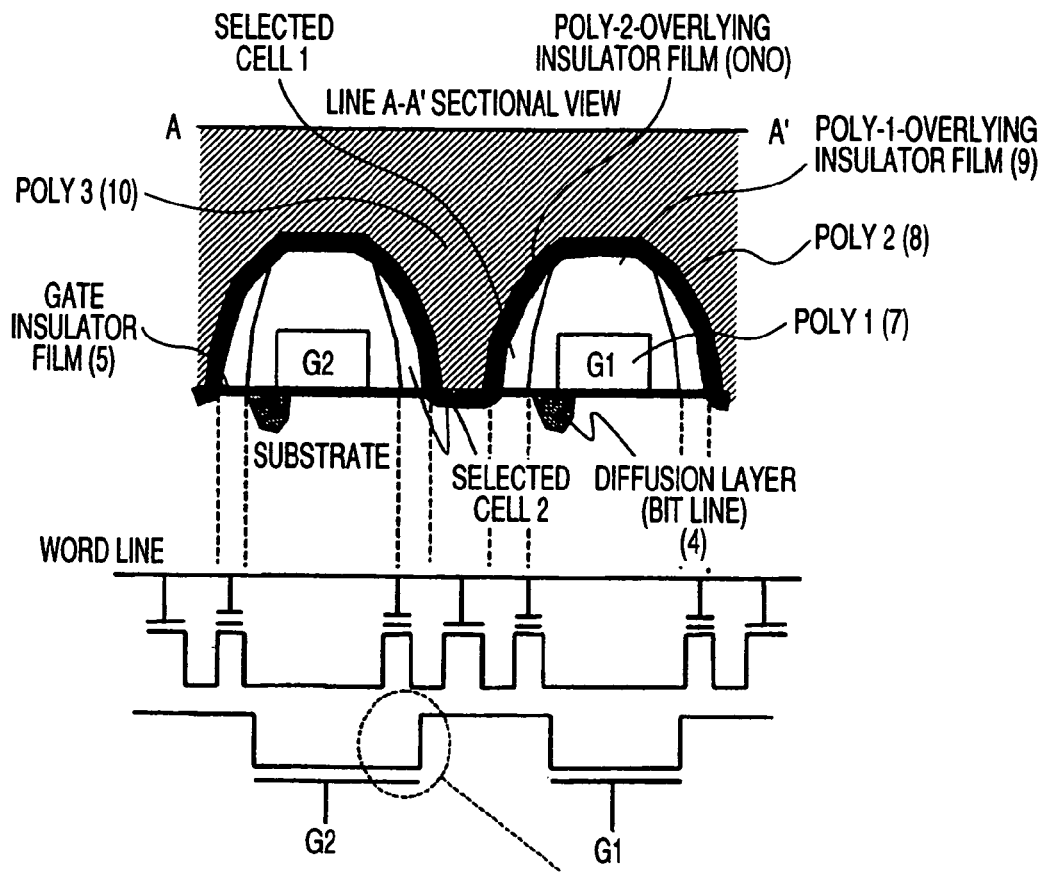
FIG. 21A is a schematic sectional view of a substrate, taken along line A-A' of FIG. 20.
Figure 21B:
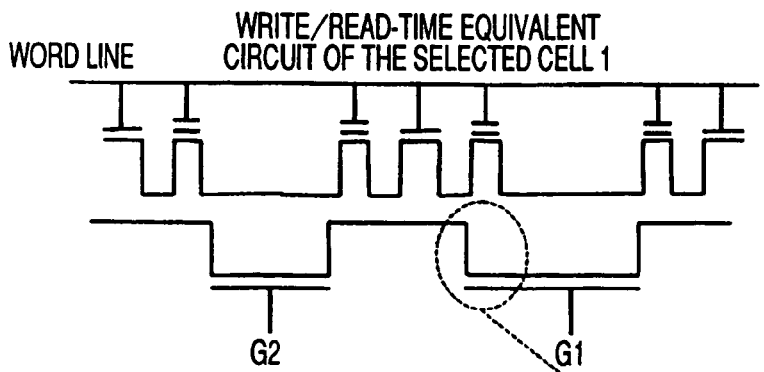
FIG. 21B is an equivalent circuit diagram at the time of write/read time.
Figure 22A:
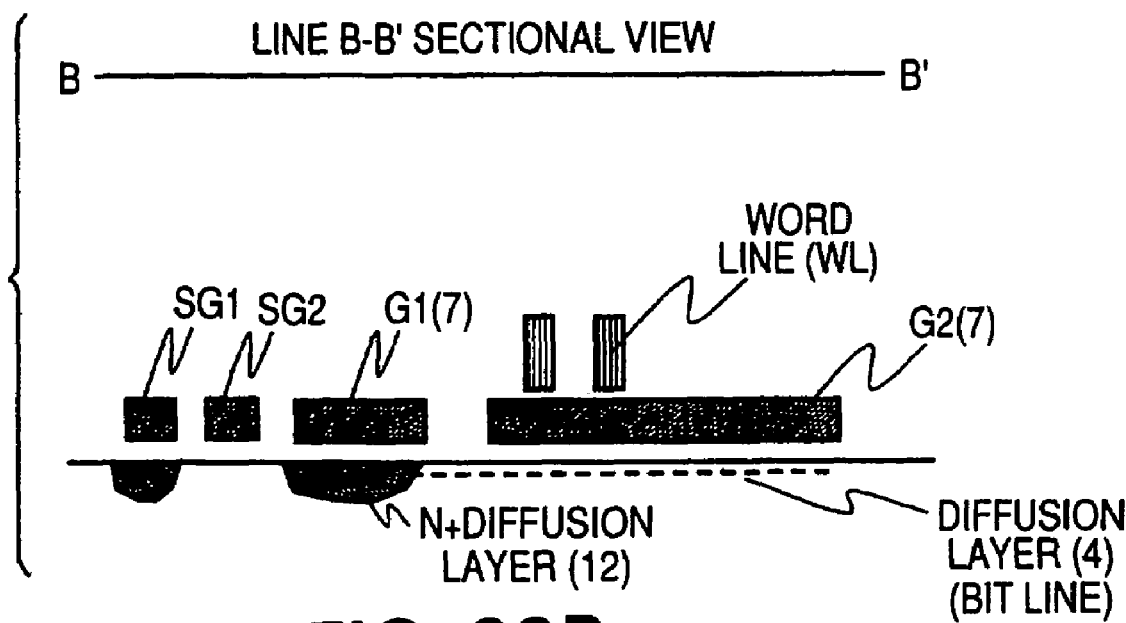
FIG. 22A is a schematic sectional view of the substrate, taken along line B-B' of FIG. 20.
Figure 22B:
FIG. 22B is an equivalent circuit diagram at the time of write/read time.

FIG. 20 is a schematic plan view of memory mat areas and a peripheral area of one of the areas. With regard to two memory cells (MC1 and MC2) illustrated in FIG. 20, the operation of a case in which one memory cell (MC1) of the two is a selected cell and a case in which the other memory cell (MC2) is a selected cell will be described. FIG. 21A is a schematic sectional view of a substrate 1, taken along line A-A' in FIG. 20; FIG. 21B is a write/read-time equivalent circuit diagram; FIG. 22A is a schematic sectional view of the substrate 1, taken along line B-B' in FIG. 20; and FIG. 22B is a write/read-time equivalent circuit diagram. FIG. 23 shows a relationship between voltages applied to a word line WL and a selector gate 7 and an n-type reversion layer 11 of each of the memory cells (MC1 and MC2), when the memory cell (MC1) is a selected memory cell; and FIG. 24 shows a relationship between voltages applied to the word line WL and the selector gate 7 and the n-type reversion layer 11 of each of the memory cells (MC1 and MC2), when the memory cell (MC2) is a selected memory cell.

In the flash memory of the present embodiment, an n-type diffusion layer (bit line) 4 is formed under one of the side walls of each of the selector gates 7; therefore, it is necessary that, between the memory cell (MC1) wherein its floating gate 8 and its n-type diffusion layer 4 are arranged near to each other and the memory cell (MC2) wherein its floating gate 8 and its n-type diffusion layer 4 are arranged apart from each other, the voltage relationships thereof when the memory cells operate are different.

In the case of writing data in, for example, the memory cell (MC1), 15 V is applied to the word line WL connected to the memory cells (MC1 and MC2). Furthermore, 6 V is applied to the gate of one (SG4) of the selector MOS transistors (SG3 and SG4) illustrated in FIG. 20, and a writing voltage of 5 V is applied to the n-type diffusion layer 4 of the memory cell (MC1) through a sense amplifier system metallic wire S2. On the other hand, 2 V is applied to the gate of one (SG1) of the selector MOS transistors (SG1 and SG2), and 0 V is applied to the n-type diffusion layer 4 of the memory cell (MC2) through a sense amplifier system metallic wire S1.

In this way, a voltage difference is generated between the two n-type diffusion layers 4, so that the n-type diffusion layer 4 of the memory cell (MC1) to which 5 V is applied becomes a drain and the n-type diffusion layer 4 of the memory cell (MC2) to which 0 V is applied becomes a source. Consequently, electrons flow from the source to the drain in the channel region between the two n-type diffusion layers 4. At this time, 6 V is applied to the selector gate 7 of the unselected memory cell (MC2) through a power source circuit system metallic wire G2, and 0 V is applied to the selector gate 7 of the selected memory cell (MC1) through a power source circuit system metallic wire G1. As a result, the generation of hot electrons is restrained in the vicinity of the region under the floating gate 8 of the memory cell (MC2) by the effect of a depletion layer extended from the n-type diffusion layer 4 of the memory cell (MC2), so that hot electrons are injected only into the floating gate 8 of the memory cell (MC1).

On the other hand, in the case of writing data in the memory cell (MC2), a writing voltage of 5 V is applied to the n-type diffusion layer 4 of the memory cell (MC2), and a voltage of 0 V is applied to the n-type diffusion layer 4 of the memory cell (MC1). In this way, the n-type diffusion layer 4 of the memory cell (MC2) becomes a drain and the n-type diffusion layer 4 of the memory cell (MC1) becomes a source. Consequently, electrons flow from the source to the drain in the channel region between the two n-type diffusion layers 4. At this time, the generation of hot electrons is restrained in the vicinity of the region under the floating gate 8 of the memory cell (MC1), wherein the floating gate 8 and the n-type diffusion layer 4 are arranged near to each other, by the effect of a depletion layer extended from the n-type diffusion layer 4. Consequently, hot electrons are injected only into the floating gate 8 of the memory cell (MC2). In short, in this case, it is unnecessary to apply a high voltage to the selector gate 7 of the memory cell (MC1) so as to form a depletion layer.

The present invention has been specifically described on the basis of various embodiments thereof. Of course, however, the present invention is not limited to these embodiments and can be modified within a scope which does not depart from the subject matter thereof.

In the above-mentioned embodiments, the floating gates are each made of a polycrystal silicon film and the second gate insulator film for separating any one of the floating gates from the corresponding control gate is composed of three insulator films is (silicon oxide, silicon nitride and silicon oxide films). However, the floating gates may each be made of a silicon nitride film, and the second gate insulator film may be a single silicon oxide film. In this case, the size of the memory cells can be made even smaller, since the film thickness of the second gate insulator film can be made as small as about 5 nm.

The above-mentioned description is directed to a case in which the present invention is applied to an AND mode flash memory included in fields related to the background art of the present invention. However, the field to which the present invention is applied is not limited thereto. The present invention can be applied as well to NOR mode flash memories. The present invention can also be applied to memory-logic-consolidated semiconductor devices, such as a system LSI (large scale integrated circuit) including a flash memory.

The present invention can be applied to nonvolatile semiconductor memory devices, such as an AND mode flash memory.

What is claimed is:

1. A method for producing a nonvolatile semiconductor for memory device, including plural memory cells which each comprise a field effect transistor comprising:
   a first gate insulator film which is formed over a main face of a semiconductor substrate of a first conductivity type;
   a selector gate which is formed over the first gate insulator film and has side faces and a top face covered with a first insulator film;
   one out of floating gates which are formed, in a side-wall form, over both sides of the selector gate and are electrically separated from the selector gate by the first insulator film;
   a second gate insulator film formed to cover the surface of the floating gate; and
   a control gate which is formed over the second gate insulator film, is electrically separated from the floating gate by the second gate insulator film, and is electrically separated from the selector gate by the second gate insulator film and the first insulator film,
   the memory cells being arranged in a matrix form along a first direction of the main face of the semiconductor substrate and along a second direction perpendicular to the first direction,
   wherein the control gates of the memory cells arranged in each row along the first direction are connected to each other to constitute a word line, and
   wherein the selector gates of the memory cells arranged in each column along the second direction are connected to each other, comprising the steps of:
   (a) forming the first gate insulator film over the main face of the semiconductor substrate, forming a first electroconductive film over the first gate insulator film, and then forming the first insulator film over the first electroconductive film;

(b) patterning the first insulator film and the first electroconductive film, thereby forming the selector gates the top of which are covered with the first insulator film;

(c) covering side faces and top faces of the selector gates with the first insulator film by oxidizing side walls of the selector gates thermally;

(d) subjecting a second electroconductive film formed over the semiconductor substrate after the step (c), thereby forming the floating gates which are formed, in a side wall form, over both sides of each of the selector gates and are electrically separated from the selector gate through the first insulator film;

(e) forming the second gate insulator film covering the surfaces of the floating gates and having portions being in contact with the surface of the semiconductor substrate; and (f) patterning a third electroconductive film formed over the second gate insulator film, thereby forming the control gates, wherein at the time of subjecting the second electroconductive film to anisotropic etching to form the floating gates, the gate length of the floating gate is made shorter than the gate length of the selector gate in each of the memory cells.

2. The method for producing a nonvolatile semiconductor for memory device according to claim 1, wherein the second gate insulator film comprises a silicon oxide film formed by a thermal oxidization process.

3. The method for producing a nonvolatile semiconductor for memory device according to claim 2, wherein the thermal oxidization process is an ISSG oxidization process.

4. The method for producing a nonvolatile semiconductor for memory device according to claim 1, wherein at the time of subjecting the second electroconductive film to anisotropic etching to form the floating gates, the aspect ratio of each of the floating gates is set to 5 or more.

5. The method for producing a nonvolatile semiconductor for memory device according to claim 1, wherein at the time of subjecting the second electroconductive film to anisotropic etching to form the floating gates, the surface of the semiconductor substrate is exposed in a part of each of areas between the word lines, and a part of the second gate insulator film, which will be formed in a subsequent step, contacts the exposed surface of the semiconductor substrate.

6. The method for producing a nonvolatile semiconductor for memory device according to claim 1, wherein oblique ion implantation is used after the step (b) to introduce an impurity into the semiconductor substrate, thereby forming a diffusion layer of a second conductivity type in a region of the semiconductor substrate under one out of side walls of each of the selector gates.

* * * * *